US011342471B2

United States Patent
Grover et al.

(10) Patent No.: US 11,342,471 B2
(45) Date of Patent: May 24, 2022

(54) THIN FILM STACKS FOR GROUP V DOPING, PHOTOVOLTAIC DEVICES INCLUDING THE SAME, AND METHODS FOR FORMING PHOTOVOLTAIC DEVICES WITH THIN FILM STACKS

(71) Applicant: First Solar, Inc., Tempe, AZ (US)

(72) Inventors: Sachit Grover, Perrysburg, OH (US);
Chungho Lee, Perrysburg, OH (US);
Xiaoping Li, Perrysburg, OH (US);
Dingyuan Lu, Perrysburg, OH (US);
Roger Malik, Perrysburg, OH (US);
Gang Xiong, Perrysburg, OH (US)

(73) Assignee: First Solar, Inc., Tempe, AZ (US)

( * ) Notice: Subject to any disclaimer, the term of this patent is extended or adjusted under 35 U.S.C. 154(b) by 0 days.

(21) Appl. No.: 16/488,808

(22) PCT Filed: Feb. 27, 2018

(86) PCT No.: PCT/US2018/019848
§ 371 (c)(1),
(2) Date: Aug. 26, 2019

(87) PCT Pub. No.: WO2018/157106
PCT Pub. Date: Aug. 30, 2018

(65) Prior Publication Data
US 2020/0035844 A1 Jan. 30, 2020

Related U.S. Application Data

(60) Provisional application No. 62/464,127, filed on Feb. 27, 2017.

(51) Int. Cl.
*H01L 31/0296* (2006.01)
*H01L 31/05* (2014.01)
(Continued)

(52) U.S. Cl.
CPC .. *H01L 31/02963* (2013.01); *H01L 31/03044* (2013.01); *H01L 31/0516* (2013.01);
(Continued)

(58) Field of Classification Search
CPC ........... H01L 31/1828; H01L 31/02963; H01L 31/02966; H01L 31/03925; H01L 31/073;
(Continued)

(56) References Cited

U.S. PATENT DOCUMENTS 8,748,214 B2 * 6/2014 DeLuca ............ H01L 31/02966
438/84
10,861,994 B2 12/2020 Abken et al.
(Continued)

FOREIGN PATENT DOCUMENTS

| CN | 106098816 A | 11/2016 |
| JP | 2012204477 A | 10/2012 |

(Continued)

OTHER PUBLICATIONS

Dictionary definition of adjacent "https://web.archive.org/web/20060415001319/www.merriam-webster.com/dictionary/adjacent" (Year: 2006).*
(Continued)

*Primary Examiner* — Andrew J Golden
(74) *Attorney, Agent, or Firm* — MacMillan, Sobanski & Todd, LLC

(57) ABSTRACT

According to the embodiments provided herein, a method for forming a photovoltaic device can include depositing a plurality of semiconductor layers. The plurality of semiconductor layers can include a doped layer that is doped with a group V dopant. The doped layer can include cadmium selenide or cadmium telluride. The method can include annealing the plurality of semiconductor layers to form an absorber layer.

20 Claims, 3 Drawing Sheets

(51) Int. Cl.
*H01L 31/18* (2006.01)
*H01L 31/0304* (2006.01)

(52) U.S. Cl.
CPC .......... *H01L 31/18* (2013.01); *H01L 31/1828* (2013.01); *H01L 31/1864* (2013.01)

(58) Field of Classification Search
CPC . H01L 31/18; H01L 31/1864; H01L 31/0516; H01L 31/0296
USPC .................................................. 136/243–265
See application file for complete search history.

(56) References Cited

U.S. PATENT DOCUMENTS

| | | | |
|---|---|---|---|
| 11,158,749 B2 | 10/2021 | Grover et al. | |
| 11,201,257 B2 | 12/2021 | Grover et al. | |
| 2009/0194166 A1* | 8/2009 | Powell | H01L 31/022466 136/260 |
| 2010/0015753 A1 | 1/2010 | Garnett | |
| 2010/0300536 A1* | 12/2010 | Aitken | H01L 31/0296 136/260 |
| 2011/0277812 A1 | 11/2011 | Buller et al. | |
| 2013/0180579 A1 | 7/2013 | Jin et al. | |
| 2014/0216550 A1* | 8/2014 | Damjanovic | H01L 31/02966 136/260 |
| 2014/0246093 A1* | 9/2014 | Chen | H01L 31/02966 136/262 |
| 2014/0261685 A1* | 9/2014 | Liao | H01L 31/1828 136/260 |
| 2014/0261688 A1* | 9/2014 | Allenic | H01L 31/02963 136/260 |
| 2014/0360565 A1 | 12/2014 | Blaydes et al. | |
| 2015/0171260 A1 | 6/2015 | Liu et al. | |
| 2015/0243816 A1* | 8/2015 | Nachtigal | B32B 27/30 136/259 |
| 2015/0357502 A1* | 12/2015 | Basol | H01L 31/073 136/260 |
| 2016/0126395 A1* | 5/2016 | Damjanovic | H01L 31/1828 136/256 |

FOREIGN PATENT DOCUMENTS

| | | | | |
|---|---|---|---|---|
| WO | WO-2007129097 A2 * | 11/2007 | ......... | H01L 31/1828 |
| WO | WO-2016133973 A1 * | 8/2016 | ......... | H01L 31/1828 |

OTHER PUBLICATIONS

Definition of buffer and window layers "https://www.teknik.uu.se/solid-state-electronics+/research-areas/solar-cells/Projects/window-layer-structures/" (Year: 2017).*
International Search Report and Written Opinion, Application No. PCT/US2018/019848, dated Jul. 31, 2018.
Colegrove et al., "Arsenic Doped Heteroepitaxial CdTe by MBE for Applications in Thin-Film Photovoltaics", 2014 IEEE 40th Photovoltaic Specialist Conference, IEEE, Jun. 8, 2014, pp. 3261-3265.
Poplawsky et al., "Structural and compositional dependence of the $CdTe_xSe_{1-x}$ alloy layer photoactivity in CdTe-based solar cells", Nature Communications, vol. 7, Jul. 27, 2016, pp. 1-10.
Paudel et al., "Enhancing the photo-currents of CdTe thin-film solar cells in both short and long wavelength regions", Applied Physics Letters, 2014, vol. 105, pp. 183510-1-183510-5.
Japanese Office Action, Application No. 2019546912, dated Feb. 7, 2020.
First Examination Report, dated Jan. 18, 2021, Indian Patent Application No. 201917037468.
Extended European Search report for European application No. 20174225.1, dated Sep. 7, 2020, pp. 1-7.
Japanese Notification of Reasons for Rejection, Application No. 2020-169527, dated Jan. 25, 2022.

* cited by examiner

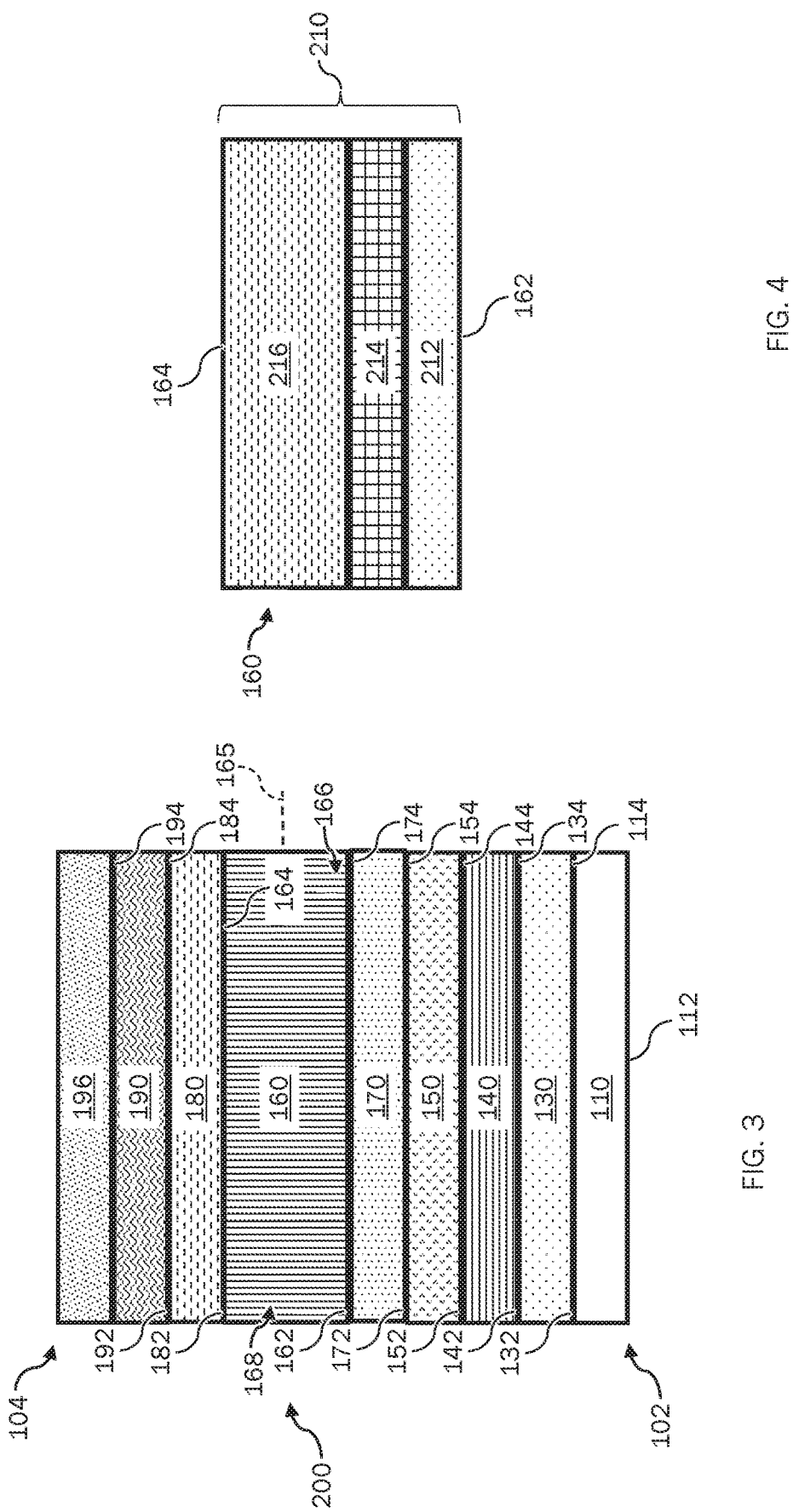

THIN FILM STACKS FOR GROUP V DOPING, PHOTOVOLTAIC DEVICES INCLUDING THE SAME, AND METHODS FOR FORMING PHOTOVOLTAIC DEVICES WITH THIN FILM STACKS

CROSS-REFERENCE TO RELATED APPLICATIONS

This is a national phase application of international application PCT/US2018/019848, filed under the authority of the Patent Cooperation Treaty on Feb. 27, 2018, published Aug. 30, 2018; which claims the benefit of U.S. Provisional Application No. 62/464,127, filed under 35 U.S.C. § 111(b) on Feb. 27, 2017.

BACKGROUND

The present specification generally relates to the use of p-type dopants in thin film photovoltaic devices and, more specifically, to the use of group V p-type dopants in thin film photovoltaic devices.

A photovoltaic device generates electrical power by converting light into direct current electricity using semiconductor materials that exhibit the photovoltaic effect. Certain types of semiconductor material can be difficult to manufacture. For example, thin film layers provided adjacent to semiconductor material can lead to inoperability or instability of the photovoltaic device. The use of group V elements as a dopant for a p-type semiconductor can be particularly difficult.

Accordingly, a need exists for alternative thin film stacks for use in thin film photovoltaic devices incorporating group V p-type dopants.

SUMMARY

The embodiments provided herein relate to thin-film stacks for use with group V dopants. These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 3 schematically depicts a photovoltaic device according to one or more embodiments shown and described herein; and FIGS. 4 and 5 schematically depict film stacks for forming absorber layers of photovoltaic devices according to one or more embodiments shown and described herein.

DETAILED DESCRIPTION

Thin film photovoltaic devices can include multiple layers created on a substrate (or superstrate). For example, a photovoltaic device can include a barrier layer, a transparent conductive oxide (TCO) layer, a buffer layer, an absorber layer, and a back contact layer formed in a stack on a substrate. Each layer may in turn include more than one layer or film. For example, absorber layer can be formed from a plurality of semiconductor layers.

Figure 1:
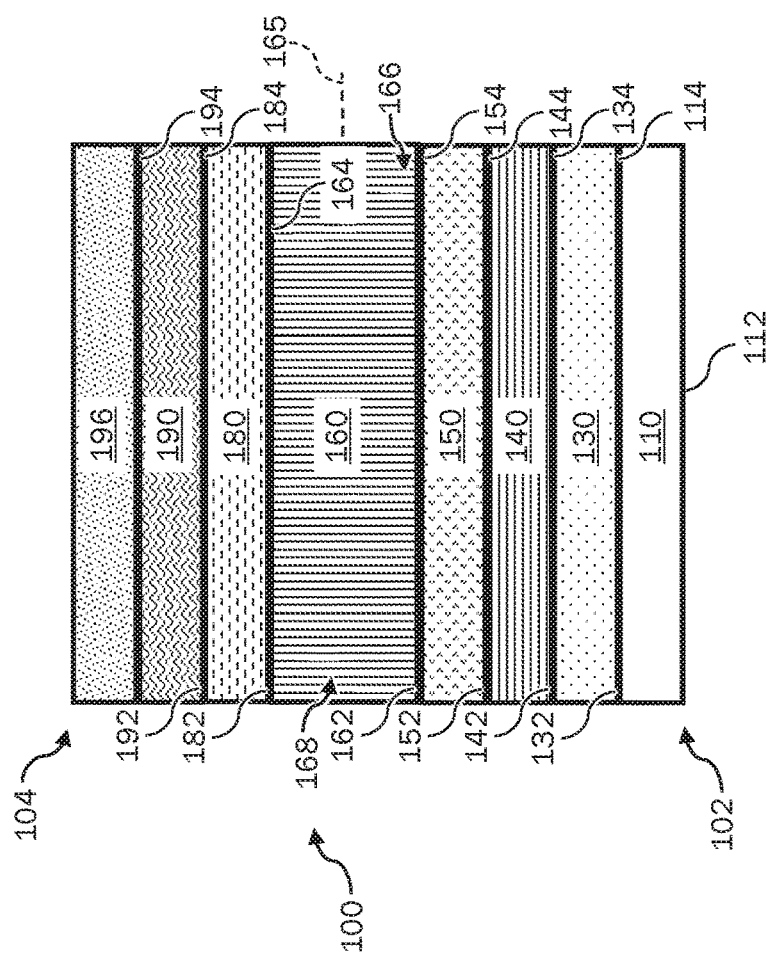
FIG. 1 schematically depicts a photovoltaic device according to one or more embodiments shown and described herein.

Referring now to FIG. 1, an embodiment of a photovoltaic device 100 is schematically depicted. The photovoltaic device 100 can be configured to receive light and transform light into electrical signals, e.g., photons can be absorbed from the light and transformed into electrical signals via the photovoltaic effect. Accordingly, the photovoltaic device 100 can define an energy side 102 configured to be exposed to a light source such as, for example, the sun. The photovoltaic device 102 can also define an opposing side 104 offset from the energy side 102. It is noted that the term "light" can refer to various wavelengths of the electromagnetic spectrum such as, but not limited to, wavelengths in the ultraviolet (UV), infrared (IR), and visible portions of the electromagnetic spectrum. The photovoltaic device 100 can include a plurality of layers disposed between the energy side 102 and the opposing side 104. As used herein, the term "layer" can refer to a thickness of material provided upon a surface. Additionally, each layer can cover all or any portion of the surface.

Figure 2:
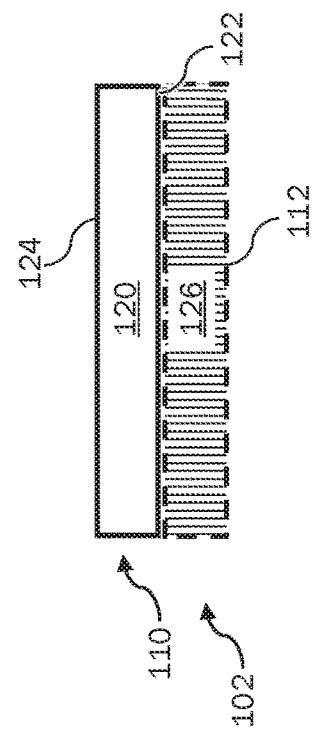
FIG. 2 schematically depicts a substrate according to one or more embodiments shown and described herein.

The photovoltaic device 100 can include a substrate 110 configured to facilitate the transmission of light into the photovoltaic device 100. The substrate 110 can be disposed at the energy side 102 of the photovoltaic device 100. Referring collectively to FIGS. 1 and 2, the substrate 110 can have a first surface 112 substantially facing the energy side 102 of the photovoltaic device 100 and a second surface 114 substantially facing the opposing side 104 of the photovoltaic device 100. One or more layers of material can be disposed between the first surface 112 and the second surface 114 of the substrate 110.

Referring collectively to FIGS. 1 and 2, the substrate 110 can include a transparent layer 120 having a first surface 122 substantially facing the energy side 102 of the photovoltaic device 100 and a second surface 124 substantially facing the opposing side 104 of the photovoltaic device 100. The transparent layer 120 can be formed from a substantially transparent material such as, for example, glass. Suitable glass can include soda-lime glass, or any glass with reduced iron content. The transparent layer 120 can have any suitable transmittance, including about 250 nm to about 1,300 nm in some embodiments. The transparent layer 120 may also have any suitable transmission percentage, including, for example, more than about 50% in one embodiment, more than about 60% in another embodiment, more than about 70% in yet another embodiment, more than about 80% in a further embodiment, or more than about 85% in still a further embodiment. In one embodiment, transparent layer 120 can be formed from a glass with about 90% transmittance. Optionally, the substrate 110 can include a coating 126 applied to the first surface 122 of the transparent layer 120. The coating 126 can be configured to interact with light or to improve durability of the substrate 110 such as, but not limited to, an antireflective coating, an antisoiling coating, or a combination thereof.

Referring again to FIG. 1, the photovoltaic device 100 can include a barrier layer 130 configured to mitigate diffusion of contaminants (e.g. sodium) from the substrate 110, which could result in degradation or delamination. The barrier layer 130 can have a first surface 132 substantially facing the energy side 102 of the photovoltaic device 100 and a second surface 134 substantially facing the opposing side 104 of the photovoltaic device 100. In some embodiments, the barrier layer 130 can be provided adjacent to the substrate 110. For example, the first surface 132 of the barrier layer 130 can be provided upon the second surface 114 of the substrate 100.

Generally, the barrier layer 130 can be substantially transparent, thermally stable, with a reduced number of pin holes and having high sodium-blocking capability, and good adhesive properties. Alternatively or additionally, the barrier layer 130 can be configured to apply color suppression to the light. The barrier layer 130 can include one or more layers of suitable material, including, but not limited to, tin oxide, silicon dioxide, aluminum-doped silicon oxide, silicon oxide, silicon nitride, or aluminum oxide. The barrier layer 130 can have any suitable thickness bounded by the first surface 132 and the second surface 134, including, for example, more than about 500 Å in one embodiment, more than about 750 Å in another embodiment, or less than about 1200 Å in a further embodiment.

Referring still to FIG. 1, the photovoltaic device 100 can include a transparent conductive oxide (TCO) layer 140 configured to provide electrical contact to transport charge carriers generated by the photovoltaic device 100. The TCO layer 140 can have a first surface 142 substantially facing the energy side 102 of the photovoltaic device 100 and a second surface 144 substantially facing the opposing side 104 of the photovoltaic device 100. In some embodiments, the TCO layer 140 can be provided adjacent to the barrier layer 130. For example, the first surface 142 of the barrier layer 140 can be provided upon the second surface 134 of the barrier layer 130. Generally, the TCO layer 140 can be formed from one or more layers of n-type semiconductor material that is substantially transparent and has a wide band gap. Specifically, the wide band gap can have a larger energy value compared to the energy of the photons of the light, which can mitigate undesired absorption of light. The TCO layer 140 can include one or more layers of suitable material, including, but not limited to, tin dioxide, doped tin dioxide (e.g., F—$SnO_2$), indium tin oxide, or cadmium stannate.

The photovoltaic device 100 can include a buffer layer 150 configured to provide an insulating layer between the TCO layer 140 and any semiconductor layers. The buffer layer 150 can have a first surface 152 substantially facing the energy side 102 of the photovoltaic device 100 and a second surface 154 substantially facing the opposing side 104 of the photovoltaic device 100. In some embodiments, the buffer layer 150 can be provided adjacent to the TCO layer 140. For example, the first surface 152 of the buffer layer 150 can be provided upon the second surface 144 of the TCO layer 140. The buffer layer 140 may include material having higher resistivity than the TCO later 140, including, but not limited to, intrinsic tin dioxide, zinc magnesium oxide (e.g., $Zn_{1-x}MgO$), silicon dioxide ($SnO_2$), aluminum oxide ($Al_2O_3$), aluminum nitride (AlN), zinc tin oxide, zinc oxide, tin silicon oxide, or a combination thereof. Generally, the material of the buffer layer 150 can be configured to substantially match the band gap of an adjacent semiconductor layer (e.g., an absorber). The buffer layer 150 may have any suitable thickness between the first surface 152 and the second surface 154, including, for example, more than about 100 Å in one embodiment, between about 100 Å and about 800 Å in another embodiment, or between about 150 Å and about 600 Å in a further embodiment.

The photovoltaic device 100 can include an absorber layer 160 configured to form a p-n junction within the photovoltaic device 100. Accordingly, absorbed photons of the light can free electron-hole pairs and generate carrier flow, which can yield electrical power. The absorber layer 160 can have a first surface 162 substantially facing the energy side 102 of the photovoltaic device 100 and a second surface 164 substantially facing the opposing side 104 of the photovoltaic device 100. A thickness of the absorber layer 160 can be defined between the first surface 162 and the second surface 164. The thickness of the absorber layer 160 can be between about 0.5 μm to about 10 μm such as, for example, between about 1 μm to about 7 μm in one embodiment, or between about 2 μm to about 5 μm in another embodiment. The absorber layer 160 can further include a midpoint 165 located in the middle of the thickness of the absorber layer 160, i.e., located at the 50% location between the first surface 162 and the second surface 164 of the absorber layer 160.

Referring still to FIG. 1, the absorber layer 160 can be formed from a p-type semiconductor material having an excess of positive charge carriers, i.e., holes. The absorber layer 160 can include any suitable p-type semiconductor material, including, for example, semi-conductor materials formed from cadmium, tellurium, selenium, sulfur, or any combination thereof. Specific examples include, but are not limited to, cadmium telluride, ternaries of cadmium, selenium and tellurium (e.g., $CdSe_xTe_{1-x}$), ternaries of cadmium, sulfur, and tellurium (e.g., $CdS_xTe_{1-x}$), quaternaries of cadmium, selenium, sulfur, and tellurium, or their equivalent. In embodiments where the absorber layer 160 comprises selenium and cadmium, the atomic percent of the selenium can be greater than about 0 atomic percent and less than about 20 atomic compared to cadmium. It is noted that the atomic percent described herein is representative of the entirety of the absorber layer 160, the atomic percentage of material at a particular location within the absorber layer 160 can vary with thickness compared to the overall composition of the absorber layer 160. In embodiments where the absorber layer 160 comprises sulfur and cadmium, the atomic percent of the sulfur can be greater than about 0 atomic percent and less than about 20 atomic compared to cadmium. It is noted that the concentration of tellurium can vary through the thickness of the absorber layer 160. For example, when the absorber layer 160 comprises a ternary of cadmium, selenium, and tellurium ($CdSe_xTe_{1-x}$), x can vary in the absorber layer 160 with distance from the first surface 162 of the absorber layer 160. Similarly, when the absorber layer 160 comprises a ternary of cadmium, sulfur, and tellurium ($CdS_xTe_{1-x}$), x can vary in the absorber layer 160 with distance from the first surface 162 of the absorber layer 160.

According to the embodiments provided herein, the absorber layer 160 can be doped with a dopant configured to manipulate the charge carrier concentration. In some embodiments, the absorber layer can be doped with a group V dopant such as, for example, arsenic, phosphorous, antimony, or a combination thereof. The total dosage of the group V dopant within the absorber layer 160 can be controlled. In some embodiments, the total dosage of the group V dopant in the absorber layer 160 is greater than about 0 atomic % and less than about atomic 0.1%, such as, for example, greater than about 0.001 atomic % and less than about 0.05 atomic % in one embodiment. Alternatively or additionally, the percent concentration profile of the group V dopant through the thickness of the absorber layer 160. Specifically, the amount of the group V dopant can vary with distance from the first surface 162 of the absorber layer 160. Furthermore, the concentration of oxygen in the absorber layer 160 can be controlled. Specifically, an average concentration of oxygen in the absorber layer 160, measured between the first surface 162 of the absorber layer 160 and the midpoint 165 of the absorber layer 160, can be less or equal to about $3\times10^{17}$ cm$^{-3}$ such as, for example, less than or equal to about $2\times10^{17}$ cm$^{-3}$ in one embodiment, between about $5\times10^{15}$ cm$^{-3}$ and about $3\times10^{17}$ cm$^{-3}$ in another embodiment, or between about $5\times10^{15}$ cm$^{-3}$ and about $2\times10^{17}$ cm$^{-3}$ in a further embodiment. It is noted that the average concentration of oxygen was determined using Time-of-Flight Secondary Ion Mass Spectrometry (TOF-SIMS).

In some embodiments, the absorber layer 160 can include absorber buffer interface region 166 formed adjacent to the first surface 162 of the absorber layer 160, and a bulk portion 168 from adjacent to the absorber buffer interface region 166, i.e., between the absorber buffer interface region 166 and the second surface 164 of the absorber layer 160. For example, the absorber buffer interface region 166 can span the first 10% of the thickness of the absorber layer 160 from the first surface 162 and the bulk portion 168 can span the remainder of the thickness of the absorber layer 160. In embodiments where the group V dopant comprises arsenic, the percent concentration profile of arsenic in the absorber buffer interface region 166 can differ from the percent concentration profile of arsenic in the bulk portion 168.

Referring still to FIG. 1, the p-n junction can be formed by providing the absorber layer 160 sufficiently close to a portion of the photovoltaic device 100 having an excess of negative charge carriers, i.e., electrons. In some embodiments, the absorber layer 160 can be provided adjacent to n-type semiconductor material. Alternatively, one or more intervening layers can be provided between the absorber layer 160 and n-type semiconductor material. In some embodiments, the absorber layer 160 can be provided adjacent to the buffer layer 150. For example, the first surface 162 of the absorber layer 160 can be provided upon the second surface 154 of the buffer layer 150.

Referring now to FIG. 3, in some embodiments, a photovoltaic device 200 can include a window layer 170 comprising n-type semiconductor material. The absorber layer 160 can be formed adjacent to the window layer 170. The window layer 170 can have a first surface 172 substantially facing the energy side 102 of the photovoltaic device 100 and a second surface 174 substantially facing the opposing side 104 of the photovoltaic device 100. In some embodiments, the window layer 170 can be positioned between the absorber layer 160 and the TCO layer 140. In one embodiment, the window layer 170 can be positioned between the absorber layer 160 and the buffer layer 140. The window layer 170 can include any suitable material, including, for example, cadmium sulfide, zinc sulfide, cadmium zinc sulfide, zinc magnesium oxide, or any combination thereof.

Referring collectively to FIGS. 1 and 3, the photovoltaic device 100 can include a back contact layer 180 configured to mitigate undesired alteration of the group V dopant and to provide electrical contact to the absorber layer 160. The back contact layer 180 can have a first surface 182 substantially facing the energy side 102 of the photovoltaic device 100 and a second surface 184 substantially facing the opposing side 104 of the photovoltaic device 100. A thickness of the back contact layer 180 can be defined between the first surface 182 and the second surface 184. The thickness of the back contact layer 180 can be between about 5 nm to about 200 nm such as, for example, between about 10 nm to about 50 nm in one embodiment.

In some embodiments, the back contact layer 180 can be provided adjacent to the absorber layer 160. For example, the first surface 182 of the back contact layer 180 can be provided upon the second surface 164 of the absorber layer 160. In some embodiments, the back contact layer 180 can be substantially copper free, i.e., can be formed from materials that do not include copper. Without being bound to theory, it is believed that copper can interfere with group V dopants (e.g., arsenic). Specifically, the back contact layer 180 can include any suitable material such as, for example, nitrogen-doped zinc telluride (ZnTe), or the like.

The photovoltaic device 100 can include a conducting layer 190 configured to provide electrical contact with the absorber layer 160. The back conducting layer 190 can have a first surface 192 substantially facing the energy side 102 of the photovoltaic device 100 and a second surface 194 substantially facing the opposing side 104 of the photovoltaic device 100. In some embodiments, the conducting layer 190 can be provided adjacent to the back contact layer 180. For example, the first surface 192 of the conducting layer 190 can be provided upon the second surface 184 of the back contact layer 180. The conducting layer 190 can include any suitable conducting material such as, for example, molybdenum nitride (MoN$_x$) doped with aluminum, molybdenum, or the like.

The photovoltaic device 100 can include a back support 196 configured to cooperate with the substrate 110 to form a housing for the photovoltaic device 100. The back support 196 can be disposed at the opposing side 102 of the photovoltaic device 100. For example, the back support 196 can be formed adjacent to conducting layer 190. The back support 196 can include any suitable material, including, for example, glass (e.g., soda-lime glass).

Figure 5:
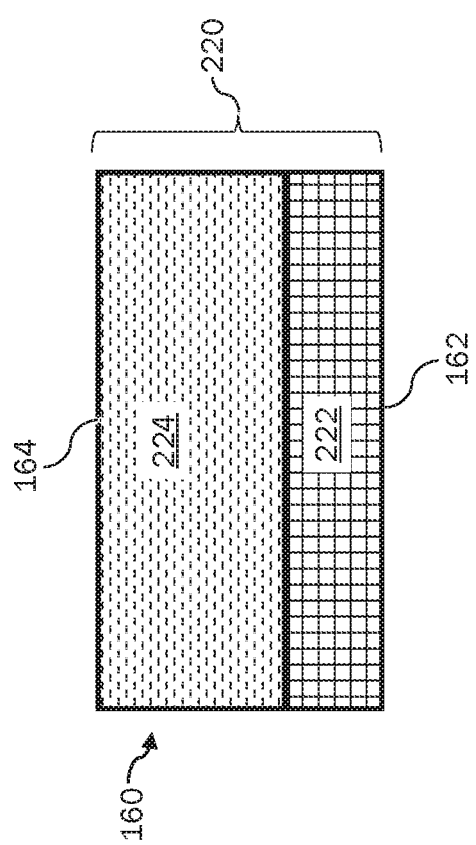

Referring collectively to FIGS. 4 and 5, the absorber layer 160 can be formed from a plurality of semiconductor layers 210. For example, the semiconductor layers 210 can be provided as a stack of thin films deposited upon one another using any known deposition technique, including vapor transport deposition. Each of the semiconductor layers 210 can include any suitable p-type semiconductor material, including, for example, semiconductor materials formed from cadmium, tellurium, selenium, sulfur, or any combination thereof. In some embodiments, the material composition of the semiconductor layers 210 can vary. After deposition, the semiconductor layers 210 can be annealed, which can cause the semiconductor layers 210 to diffuse into one another to form a blended material composition having the characteristics described above with respect to the absorber layer 160. In some embodiments, one or more of the semiconductor layers 210 can be provided as a doped layer, i.e., doped with a group V dopant as described herein. In further embodiments, a majority of the absorber layer 160 can be formed from the doped layer, i.e., the doped layer can be the thickest of the semiconductor layers 210.

With reference to FIG. 4, in some embodiments, the semiconductor layers 210 can comprise a first semiconductor layer 212, a second semiconductor layer 214, and a third semiconductor layer 216. The first semiconductor layer 212 can be the layer nearest to the first surface 162 of the absorber layer 160. The third semiconductor layer 216 can be the layer nearest to the second surface 164 of the absorber layer 160. The second semiconductor layer 214 can be positioned between the first semiconductor layer 212 and the third semiconductor layer 216. In one embodiment, the first semiconductor layer 212 can comprise cadmium selenide (CdSe), the second semiconductor layer 214 can comprise cadmium telluride (CdTe), and the third semiconductor layer 216 can comprise cadmium telluride (CdTe) doped with arsenic. The third semiconductor layer 216 can be the thickest layer, and the second semiconductor layer 214 can be thicker than the first semiconductor layer 212. For example, a ratio of the thickness of the third semiconductor layer 216 to the first semiconductor layer 212 can be greater than about 4 such as, for example, greater than about 6 in one embodiment, or greater than about 8 in another embodiment. A ratio of the thickness of the second semiconductor layer 214 to the first semiconductor layer 212 can be greater than about 1.1 and less than about 10 such as, for example, greater than about 1.25 and less than about 5 in one embodiment.

In another embodiment, the first semiconductor layer 212 can comprise cadmium telluride (CdTe), the second semiconductor layer 214 can comprise cadmium selenide (CdSe), and the third semiconductor layer 216 can comprise cadmium telluride (CdTe) doped with arsenic. The third semiconductor layer 216 can be the thickest layer, and the second semiconductor layer 214 can be thicker than the first semiconductor layer 212.

In yet another embodiment, the first semiconductor layer 212 can comprise a ternary of cadmium, selenium and tellurium (e.g., $CdSe_xTe_{1-x}$), the second semiconductor layer 214 can comprise cadmium telluride (CdTe), and the third semiconductor layer 216 can comprise cadmium telluride (CdTe) doped with arsenic. The third semiconductor layer 216 can be the thickest layer, and the first semiconductor layer 212 can be thicker than the second semiconductor layer 214.

In a further embodiment, the first semiconductor layer 212 can comprise cadmium sulfide (CdS), the second semiconductor layer 214 can comprise cadmium telluride (CdTe), and the third semiconductor layer 216 can comprise cadmium telluride (CdTe) doped with arsenic. The third semiconductor layer 216 can be the thickest layer, and the second semiconductor layer 214 can be thicker than the first semiconductor layer 212.

Referring still to FIG. 4, in some embodiments, the first semiconductor layer 212 can comprise cadmium telluride (CdTe), the second semiconductor layer 214 can comprise cadmium selenide (CdSe) doped with arsenic, and the third semiconductor layer 216 can comprise cadmium telluride (CdTe). Alternatively, the third semiconductor layer 216 can comprise cadmium telluride (CdTe) doped with arsenic. The third semiconductor layer 216 can be the thickest layer, and the second semiconductor layer 214 can be thicker than the first semiconductor layer 212. For example, a ratio of the thickness of the third semiconductor layer 216 to the first semiconductor layer 212 can be greater than about 10 such as, for example, greater than about 20 in one embodiment, or greater than about 25 in another embodiment. A ratio of the thickness of the second semiconductor layer 214 to the first semiconductor layer 212 can be greater than about 1.1 and less than about 10 such as, for example, greater than about 1.25 and less than about 5 in one embodiment.

According to the embodiments provided herein, the first semiconductor layer 212 can comprise cadmium telluride (CdTe), the second semiconductor layer 214 can comprise cadmium selenide (CdSe), and the third semiconductor layer 216 can comprise cadmium telluride (CdTe) doped with arsenic. The third semiconductor layer 216 can be the thickest layer, and the second semiconductor layer 214 can be thicker than the first semiconductor layer 212. For example, a ratio of the thickness of the third semiconductor layer 216 to the first semiconductor layer 212 can be greater than about 10, and a ratio of the thickness of the second semiconductor layer 214 to the first semiconductor layer 212 can be greater than about 1.1 and less than about 10.

With reference to FIG. 5, in some embodiments, the semiconductor layers 220 can comprise a first semiconductor layer 222, and a second semiconductor layer 224. The first semiconductor layer 222 can be the layer nearest to the first surface 162 of the absorber layer 160. The second semiconductor layer 224 can be the layer nearest to the second surface 164 of the absorber layer 160. In one embodiment, the first semiconductor layer 222 can comprise cadmium selenide (CdSe) doped with arsenic, and the second semiconductor layer 224 can comprise cadmium telluride (CdTe) doped with arsenic. The second semiconductor layer 224 can be thicker than the first semiconductor layer 222. For example, a ratio of the thickness of the second semiconductor layer 224 to the first semiconductor layer 222 can be greater than about 6 such as, for example, greater than about 8 in one embodiment, or greater than about 10 in another embodiment.

In another embodiment, the first semiconductor layer 222 can comprise cadmium selenide (CdSe), and the second semiconductor layer 224 can comprise cadmium telluride (CdTe) doped with arsenic. The second semiconductor layer 224 can be thicker than the first semiconductor layer 222. For example, a ratio of the thickness of the second semiconductor layer 224 to the first semiconductor layer 222 can be greater than about 7 such as, for example, greater than about 9 in one embodiment, or greater than about 10 in another embodiment.

It should now be understood that the embodiments described herein relate to thin film photovoltaic devices and thin film stacks for use with photovoltaic devices that facilitate the use of group V dopants within p-type semiconductor materials. The described film stacks can provide for operational group V doped p-type CdTe solar devices. Moreover, the back contacts described herein can be provided with copper free material to improve the stability of the dopants.

According to the embodiments provided herein, a method for forming a photovoltaic device can include depositing a plurality of semiconductor layers. The plurality of semiconductor layers can include a doped layer that is doped with a group V dopant. The doped layer can include cadmium selenide or cadmium telluride. The method can include annealing the plurality of semiconductor layers to form an absorber layer. The absorber layer can include cadmium, selenium, and tellurium. A total dosage of the group V dopant in the absorber layer can be greater than 0 atomic % and less than 0.1 atomic %.

In a further embodiment, a photovoltaic device can include an absorber layer and a back contact layer. The absorber layer can have a first surface facing an energy side of the photovoltaic device and a second surface facing an opposing side of the photovoltaic device. The absorber layer can include cadmium and tellurium. The absorber layer can be doped with a group V dopant. The back contact layer can be provided upon the second surface of the absorber layer. The back contact layer can include nitrogen-doped zinc telluride.

In another embodiment, a photovoltaic device can include an absorber layer and a back contact layer. The absorber layer can have a first surface facing an energy side of the photovoltaic device and a second surface facing an opposing side of the photovoltaic device. The absorber layer can include cadmium and tellurium. The absorber layer can be doped with a group V dopant. The back contact layer can be provided upon the second surface of the absorber layer. The back contact layer can be substantially free of copper.

In yet another embodiment, photovoltaic device can include a buffer layer and an absorber layer. The buffer layer can have a first surface facing an energy side of the photovoltaic device and a second surface facing an opposing side of the photovoltaic device. The absorber layer can be provided upon the second surface of the buffer layer. The absorber layer can be formed from a plurality of semiconductor layers. The plurality of semiconductor layers can include a doped layer comprising cadmium and tellurium. The doped layer can be doped with a group V dopant.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method for forming a photovoltaic device comprising:
    depositing a plurality of semiconductor layers by vapor transport deposition, wherein:
        the plurality of semiconductor layers comprise a doped layer that is doped with a group V dopant, and
        the doped layer comprises cadmium selenide, cadmium telluride, or a combination thereof; and
    forming a blended material composition from the plurality of semiconductor layers by annealing the plurality of semiconductor layers, whereby an absorber layer is formed, wherein:
        the absorber layer comprises cadmium, selenium, and tellurium, and
        a total dosage of the group V dopant in the absorber layer is greater than 0 atomic percent and less than 0.1 atomic percent; and
    wherein the plurality of semiconductor layers are deposited on a buffer layer.

2. The method of claim 1, wherein the doped layer comprises cadmium telluride, and the plurality of semiconductor layers includes an additional layer comprising cadmium selenide.

3. The method of claim 2, wherein the additional layer is doped with arsenic.

4. The method of claim 2, wherein the doped layer is thicker than the additional layer.

5. The method of claim 4, wherein a ratio of a thickness of the doped layer to a thickness of the additional layer is greater than 6.

6. The method of claim 2, wherein the plurality of semiconductor layers comprises a third layer comprising cadmium telluride.

7. The method of claim 1, comprising forming a back contact layer over the absorber layer, wherein the back contact layer is substantially free of copper.

8. The method of claim 7, wherein:
    the absorber layer has a first surface and a second surface offset by a thickness;
    the back contact layer is formed upon the second surface of the absorber layer; and
    an average concentration of oxygen in the absorber layer measured between the first surface of the absorber layer and a midpoint of the absorber layer is between $5 \times 10^{15}$ cm$^{-3}$ and $3 \times 10^{17}$ cm$^{-3}$.

9. The method of claim 7, wherein the back contact layer comprises nitrogen-doped zinc telluride.

10. The method of claim 9, comprising forming a conducting layer over the back contact layer.

11. The method of claim 1, wherein the doped layer is further from the buffer layer than any other layer of the plurality of semiconductor layers.

12. The method of claim 1, wherein:
    the absorber layer has a first surface provided upon a second surface of the buffer layer;
    an absorber buffer interface region is formed adjacent to the first surface of the absorber layer;
    a percent concentration profile of the Group V dopant is formed in the absorber layer with distance from the first surface of the absorber layer; and
    the percent concentration profile of the Group V dopant at the absorber buffer interface differs from the percent concentration profile of the Group V dopant in a bulk portion of the absorber layer.

13. The method of claim 1, wherein the buffer layer comprises intrinsic tin dioxide, zinc magnesium oxide, silicon dioxide, aluminum oxide, aluminum nitride, or a combination thereof.

14. The method of claim 1, wherein the group V dopant is arsenic.

15. The method of claim 1, wherein the absorber layer has a thickness between about 0.5 μm to about 10 μm.

16. A method for forming a photovoltaic device comprising:
    depositing a plurality of semiconductor layers on a buffer layer, wherein:
        the plurality of semiconductor layers comprise a doped layer and an additional layer, wherein:
            the doped layer comprises cadmium telluride doped with a group V dopant, wherein the group V dopant comprises arsenic, phosphorous, antimony, or a combination thereof,
            the additional layer comprises cadmium selenide,
            the doped layer is thicker than the additional layer, and
            a ratio of a thickness of the doped layer to a thickness of the additional layer is greater than 6;
    forming a blended material composition from the plurality of semiconductor layers by annealing the plurality of semiconductor layers, whereby an absorber layer is formed, wherein:
        the absorber layer has a first surface provided upon a second surface of the buffer layer,
        the absorber layer comprises cadmium, selenium, and tellurium, and
        a total dosage of the group V dopant in the absorber layer is greater than 0 atomic percent and less than 0.1 atomic percent; and
    forming a back contact layer on the absorber layer, wherein the back contact is substantially free of copper.

17. The method of claim 1, wherein the absorber layer comprises a ternary of cadmium, selenium, and tellurium.

18. The method of claim 17, wherein the absorber layer comprises greater than about 0 atomic percent and less than about 20 atomic percent of selenium compared to cadmium.

19. A method for forming an absorber layer of a photovoltaic device comprising:

first, depositing a first semiconductor layer over a buffer layer by vapor transport deposition, wherein the first semiconductor layer comprises cadmium selenide;

second, depositing a second semiconductor layer over the first semiconducting layer by vapor transport deposition, wherein the second semiconductor layer comprises cadmium telluride;

third, depositing a third semiconductor layer over the second semiconductor layer by vapor transport deposition, wherein the third semiconductor layer comprises cadmium telluride doped with arsenic; and forming a blended material composition from the first, second, and third semiconductor layers by annealing the first, second, and third semiconductor layers, whereby the absorber layer is formed, wherein:

the absorber layer has a first surface provided upon a second surface of the buffer layer, the absorber layer comprises cadmium, selenium, and tellurium, and a total dosage of the arsenic dopant in the absorber layer is greater than 0 atomic percent and less than 0.1 atomic percent.

20. The method of claim 19, wherein the third semiconductor layer is thicker than the first semiconductor layer, and a ratio of the thickness of the third semiconductor layer to the thickness of the first semiconductor layer is greater than 4:1.

* * * * *